United States Patent
Dadvand et al.

(10) Patent No.: US 12,139,569 B2
(45) Date of Patent: *Nov. 12, 2024

(54) FILLER PARTICLES FOR POLYMERS

(71) Applicant: TEXAS INSTRUMENTS INCORPORATED, Dallas, TX (US)

(72) Inventors: Nazila Dadvand, Santa Clara, CA (US); Benjamin Stassen Cook, Los Gatos, CA (US); Archana Venugopal, Santa Clara, CA (US); Luigi Colombo, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 34 days.

This patent is subject to a terminal disclaimer.

(21) Appl. No.: 17/675,055

(22) Filed: Feb. 18, 2022

(65) Prior Publication Data

US 2022/0169773 A1    Jun. 2, 2022

Related U.S. Application Data

(62) Division of application No. 16/229,971, filed on Dec. 21, 2018, now Pat. No. 11,254,775.

(Continued)

(51) Int. Cl.
*C08F 292/00* (2006.01)
*C08F 8/42* (2006.01)
(Continued)

(52) U.S. Cl.
CPC .............. *C08F 292/00* (2013.01); *C08F 8/42* (2013.01); *C08J 5/005* (2013.01); *C08K 3/042* (2017.05); *C08K 3/08* (2013.01); *C08K 7/00* (2013.01); *C08L 33/12* (2013.01); *G03F 1/78* (2013.01); *C08K 2003/085* (2013.01);
(Continued)

(58) Field of Classification Search
CPC ...... C08K 9/04; C08K 3/04–046; C08K 3/08; C08K 7/00; C08J 5/005; C08J 3/02; C08J 5/042; C08F 292/00
See application file for complete search history.

(56) References Cited

U.S. PATENT DOCUMENTS 7,653,279 B1    1/2010    Jacobsen
8,906,593 B1    12/2014   Nowak et al.
(Continued)

FOREIGN PATENT DOCUMENTS

RU    2577273        3/2016
WO    2016080910    5/2016

OTHER PUBLICATIONS

Li, et al. "High-Density Three-Dimension Graphene Macroscopic Objects for High-Capacity Removal of Heavy Metal Ions," Scientific Reports I 3: 2125 I DOI: 10.1038/srep02125, 2013,6 pages.
(Continued)

*Primary Examiner* — Kregg T Brooks
(74) *Attorney, Agent, or Firm* — Frank D. Cimino

(57) ABSTRACT

A method of forming a composite material includes photo-initiating a polymerization of a monomer in a pattern of interconnected units to form a polymer microlattice. Unpolymerized monomer is removed from the polymer microlattice. The polymer microlattice is coated with a metal. The metal-coated polymer microlattice is dispersed in a polymer matrix.

16 Claims, 4 Drawing Sheets

Related U.S. Application Data

(60) Provisional application No. 62/611,511, filed on Dec. 28, 2017.

(51) Int. Cl.

| | | |
|---|---|---|
| C08J 5/00 | (2006.01) | |
| C08K 3/04 | (2006.01) | |
| C08K 3/08 | (2006.01) | |
| C08K 7/00 | (2006.01) | |
| C08L 25/06 | (2006.01) | |
| C08L 33/12 | (2006.01) | |
| G03F 1/78 | (2012.01) | |

(52) U.S. Cl.
CPC ............... *C08K 2003/0862* (2013.01); *C08K 2201/013* (2013.01); *C08L 25/06* (2013.01)

(56) References Cited

U.S. PATENT DOCUMENTS

| | | | |
|---|---|---|---|
| 9,415,562 B1 | 8/2016 | Schaedler et al. | |
| 10,748,999 B2* | 8/2020 | Cook | H01L 29/151 |
| 10,804,201 B2* | 10/2020 | Venugopal | H01L 21/7685 |
| 11,390,527 B2* | 7/2022 | Cook | C01B 32/194 |
| 2005/0271881 A1 | 12/2005 | Hong | |
| 2006/0148963 A1* | 7/2006 | Dion | C08L 51/04 |
| | | | 524/495 |
| 2006/0186502 A1 | 8/2006 | Shimotani et al. | |
| 2007/0199826 A1 | 8/2007 | Son et al. | |
| 2010/0143701 A1 | 6/2010 | Zhu et al. | |
| 2012/0261673 A1 | 10/2012 | Schulze et al. | |
| 2013/0115462 A1 | 5/2013 | Mazyar | |
| 2013/0189444 A1 | 7/2013 | Kub et al. | |
| 2013/0230722 A1 | 9/2013 | Fujii et al. | |
| 2014/0140647 A1 | 5/2014 | Saxton | |
| 2014/0151111 A1 | 6/2014 | Shah et al. | |
| 2014/0315093 A1 | 10/2014 | Greer et al. | |
| 2015/0176132 A1 | 6/2015 | Hundley et al. | |
| 2016/0304346 A1 | 10/2016 | Zhang et al. | |
| 2017/0044016 A1 | 2/2017 | Smith et al. | |
| 2017/0082569 A1 | 3/2017 | Sommer et al. | |
| 2017/0200909 A1 | 7/2017 | Sonkusale et al. | |
| 2017/0278930 A1 | 9/2017 | Ruhl et al. | |
| 2018/0088462 A1 | 3/2018 | Vyatskikh et al. | |
| 2019/0013386 A1 | 1/2019 | Shinohara et al. | |

OTHER PUBLICATIONS

T. A. Schaedler, et al., Ultralight Metallic Microlattices; Science 334 (2011) 962-965.

Xiaoyu Zheng et. al., Ultralight, Ultrastiff Mechanical Metamaterials; Science 344 (2014) 1373-1377.

Y. T. Liang, et al., Towards Rationally Designed Graphene-Based Materials and Devices, Macromol. Chem. Phys. 213 (2012) 1091-1100.

\* cited by examiner

FILLER PARTICLES FOR POLYMERS

CROSS-REFERENCE TO RELATED APPLICATIONS

This application is a divisional of U.S. patent application Ser. No. 16/229,971 filed Dec. 21, 2018, which claims priority to U.S. Provisional Patent Application No. 62/611,511 filed Dec. 28, 2017. This application is related to: (a) U.S. patent application Ser. No. 16/229,668 filed Dec. 21, 2018, which claims priority to U.S. Provisional Patent Application No. 62/611,347 filed Dec. 28, 2017; (b) U.S. patent application Ser. No. 16/229,822 filed Dec. 21, 2018, which claims priority to U.S. Provisional Patent Application No. 62/611,483 filed Dec. 28, 2017; (c) U.S. patent application Ser. No. 16/230,070 filed Dec. 21, 2018, which claims priority to U.S. Provisional Patent Application No. 62/611,499 filed Dec. 28, 2017; (d) U.S. patent application Ser. No. 16/229,827 filed Dec. 21, 2018 (issued as U.S. Pat. No. 10,748,999); and (e) U.S. patent application Ser. No. 16/230,045 filed Dec. 21, 2018, which claims priority to U.S. Provisional Patent Application No. 62/611,554 filed Dec. 29, 2017. The contents of all the above-identified applications are hereby incorporated herein by reference in their entireties.

BACKGROUND

Graphene is a single-layer $sp^2$-hybridized 2D network of carbon atoms that conceptually serves as the basis of many important allotropes of carbon. It can be stacked to form 3D graphite, rolled to form 1D carbon nanotubes, and fused to form 0D fullerenes. Owing to its strongly delocalized electron configuration, graphene exhibits exceptional charge carrier mobility, thermal conductivity, mechanical strength, and chemical stability. However, like other nanomaterials, the properties of graphene depend on its size, atomic structure, and physical environment. Graphene and graphene-based materials have tailorable properties that can be exploited in a broad range of devices, including transistors, capacitors, electron field emitters, transparent conductors, sensors, catalysts, and drug delivery agents. Other 2D crystals, most notably boron nitride and molybdenum disulfide, have also been isolated.

Two-dimensional (2D) $sp^2$-bonded carbon exists in the form of graphene, buckyballs and carbon nanotubes (CNTs). Graphene is "flat" or 2D, fullerenes ("Buckyballs") are spherical or 0D, and CNTs are tubes in 1D. Forming these materials in a singular, regular, repeatable structure has not previously been achieved. Superstructures of these materials may provide very strong, light, highly thermally and electrically conductive structures. Attempts have been made to fabricate $sp^2$-bonded sponges as shown in FIG. 1A, but those structures are irregular with properties that vary with position.

The isolation of graphene via the mechanical exfoliation of graphite has sparked strong interest in two-dimensional (2D) layered materials. The properties of graphene include exceptional strength, and high electrical and thermal conductivity, while being lightweight, flexible and transparent. This opens the possibility of a wide range of potential applications, including high-speed transistors and sensors, barrier materials, solar cells, batteries, and composites.

Other classes of 2D materials of interest include transition metal dichalcogenide (TMDC) materials, hexagonal boron nitride (h-BN), as well as those based on Group 14 elements, such as silicene and germanene. The properties of these materials can range from semi-metallic, for example, $NiTe_2$ and $VSe_2$, to semiconducting, for example, $WSe_2$ and $MoS_2$, to insulating, for example, hexagonal boron nitride (h-BN).

Growth of regular 3D superstructures using $sp^2$-bonded carbon may address the shortcomings of the flexible $sp^2$ carbons for 3D applications given that hexagonally arranged carbon is strong, chemically inert, electrically and thermally conductive, and optically transparent. Such 3D superstructures may find use in many applications from packaging, thin optically transparent electrically conductive strong thin films, and more.

When a carbon atom is attached to three groups (or, as in the case of graphene, three other carbon atoms) and so is involved in three a bonds, it requires three orbitals in the hybrid set. This requires that it be $sp^2$ hybridized.

An $sp^2$-hybridized bond has 33% s and 67% p character. The three $sp^2$ hybrid orbitals point towards the corners of a triangle at 120° to each other. Each $sp^2$ hybrid is involved in a σ bond. The remaining p orbital forms the π bond. A carbon double bond may be viewed as a σ+π bond.

SUMMARY

In one example, a composite material 44 comprises a polymer matrix 42 with filler particles 40 dispersed within the polymer matrix. The filler particles have a microstructure comprising a plurality of interconnected units with the units formed of graphene, metallic, or ceramic tubes. The microstructure may comprise a plurality of interconnected units including: at least a first unit formed of first graphene tubes; and a second unit formed of second graphene tubes wherein one or more of the second graphene tubes are connected to one or more of the first graphene tubes. The tubes that form the microstructure may be arranged in an ordered structure and form symmetric patterns that repeat along the principal directions of three-dimensional space. Such micro-structured particles used as fillers 40 in composite materials 44 such as filled organic, inorganic, or organic-inorganic polymers may enhance certain characteristics of the resulting composite such as strength, thermal conductivity, and/or electrical conductivity.

A method of forming a graphene microstructure is described herein which comprises: photo-initiating the polymerization of a monomer in a pattern of interconnected units to form a polymer microlattice; removing unpolymerized monomer; coating the polymer microlattice with a metal; removing the polymer microlattice to leave a metal microlattice; depositing graphitic carbon on the metal microlattice; converting the graphitic carbon to graphene; and removing the metal microlattice.

Micron-size particulate fillers 40 (for example carbon nanotubes (CNTs), graphene, metallic, ceramic, metallic-ceramic, etc.) may be fabricated using a self-propagating photopolymer waveguide technique to selectively initiate polymerization of a photomonomer in a repeating pattern.

The fillers fabricated by this method may then be mixed with an organic, inorganic, or organic-inorganic polymeric matrix 42 followed by appropriate processing such as hot molding, cold molding and annealing, etc. to fabricate the composite 44.

The fillers 40 fabricated by this method may then be mixed with a pre-polymer i.e., an oligomer of an organic or inorganic or organic-inorganic polymeric matrix followed by curing/polymerization such as by UV irradiation, heat treatment, cold molding followed by annealing, and hot molding to fabricate the composite 44.

The fabricated microlattice fillers 40 can be surface-modified through chemical grafting of appropriate functional groups before composite fabrication. The type of grafted functional groups may be selected for compatibility with the organic polymeric matrix 42.

The oligomer or pre-polymer matrix may be functionalized before the fabricating of a related composite with the fillers 40.

The fillers 40, as well as the pre-polymer matrix 42, may be functionalized before fabricating the composites 44

BRIEF DESCRIPTION OF THE DRAWINGS

FIG. 4 is a schematic diagram of example superlattice fillers being incorporated within an organic polymeric matrix such as polyvinylidene difluoride (PVDF), polyethylene, polybutadiene, polytetrafluoroethylene (PTFE), and the like.

DETAILED DESCRIPTION

Figure 1A:
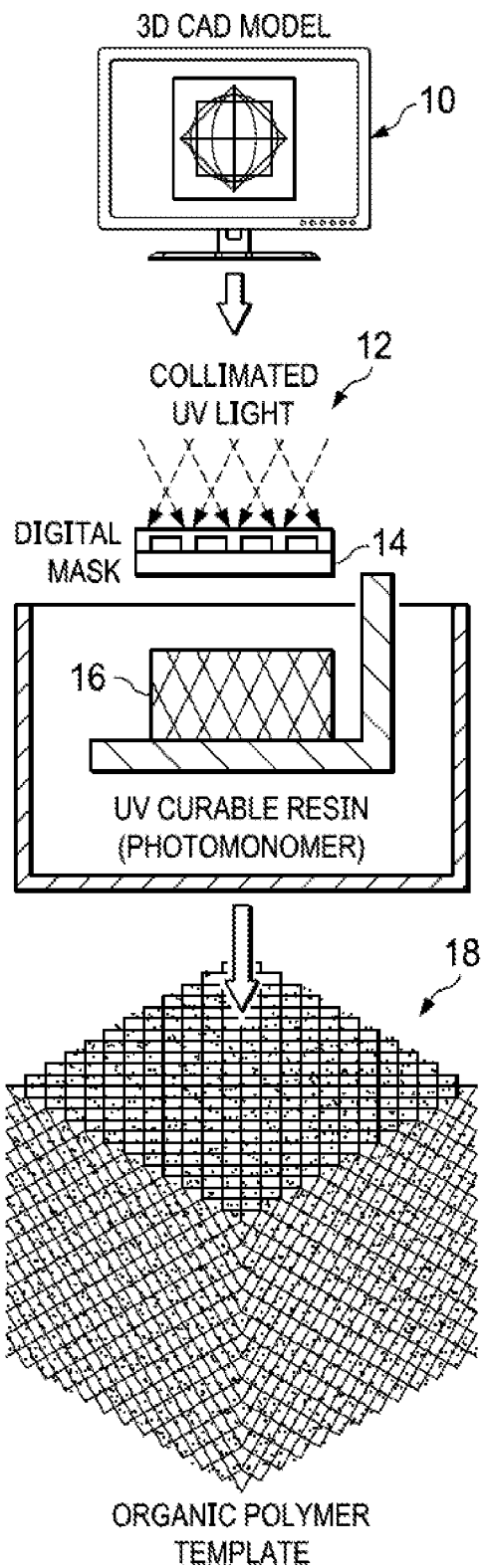
FIG. 1A is a schematic drawing of a fabrication process for a metal-based microlattice template in accordance with an example.

An organic/inorganic superstructure may be used as a template for the formation of a 3D metal superstructure that may then be used to grow e.g. graphitic carbon on the surface of the metal. The template may be fabricated through a self-propagating photopolymer waveguide technique (see, e.g., Xiaoyu Zheng et. al., Ultralight, Ultrastiff Mechanical Metamaterials; Science 344 (2014) 1373-1377 and T. A. Schaedler, et al., Ultralight Metallic Microlattices; Science 334 (2011) 962-965). As illustrated schematically in FIG. 1A, an interconnected 3D photopolymer lattice may be produced upon exposure of an appropriate liquid photomonomer 16 to collimated UV light 12 through a specifically designed (e.g. using a computer-aided design model 10) digital mask 14 that contains openings with certain spacing and size. The fabricated organic polymer template microlattice 18 may then be then coated by electroless copper or other suitable metal (e.g. Ni, Co, Au, Ag, Cu, and alloys thereof) followed by etching away the organic polymeric matrix (scaffold). The resulting metal-based microlattice may be then used as a template to grow the graphitic carbon. The thickness of the electroless plated metal may be controlled in the range of nanometer to micrometer by adjusting the plating time, temperature, and/or plating chemistry.

FIG. 1A schematically illustrates an example fabrication process of organic polymeric microlattices (scaffolds) 18 before coating with electroless plating.

This description includes a "periodically structured" carbon nanostructure. Conventional carbon nanostructures are irregular and have much larger dimensions than those which may be achieved using the methodology described herein.

This process may be used to create a regular array, and the superstructure dimensions (unit) and structure may be optimized for strength, thermal and other fundamental properties.

Aspects of this procedure include:
it provides a regular structure with defined dimensions;
it can form very thin metal (e.g. Ni, Co, Cu, Ag, Au) microlattices;
it enables the formation of graphitic carbon on very thin metals by a surface-limited process for very thin metal wires or tubes.

This process uses a polymeric structure as a template for such fabrication with the subsequent formation of a metal superstructure that may then be exposed to a hydrocarbon (e.g. methane, ethylene, acetylene, benzene) to form graphitic carbon, followed by etching of the metal from under the graphitic carbon using appropriate etchants such as, for example, $FeCl_3$ or potassium permanganate.

Collimated UV light 12 through a photomask 14 or multi-photon lithography may be used in a photo-initiated polymerization to produce a polymer microlattice 18 comprising a plurality of interconnected units. Example polymers include polystyrene and poly(methyl methacrylate) (PMMA). After polymerization in the desired pattern, the remaining un-polymerized monomer may be removed.

The polymer structure (polymer scaffold) may then be plated with a suitable metal using an electroless plating process.

Electroless nickel plating (EN) is an auto-catalytic chemical technique that may be used to deposit a layer of nickel-phosphorus or nickel-boron alloy on a solid workpiece, such as metal, plastic, or ceramic. The process relies on the presence of a reducing agent, for example hydrated sodium hypophosphite ($NaPO_2H_2 \cdot H_2O$) which reacts with the metal ions to deposit metal. Alloys with different percentages of phosphorus, ranging from 2-5 (low phosphorus) to up to 11-14 (high phosphorus) are possible. The metallurgical properties of the alloys depend on the percentage of phosphorus.

Electroless plating has several advantages over electroplating. Free from flux-density and power supply issues, it provides an even deposit regardless of workpiece geometry, and with the proper pre-plate catalyst, may deposit on non-conductive surfaces. In contradistinction, electroplating can only be performed on electrically conductive substrates.

Before performing electroless plating, the material to be plated must be cleaned by a series of chemicals; this is known as the pre-treatment process. Failure to remove unwanted "soils" from the part's surface results in poor plating. Each pre-treatment chemical must be followed by water rinsing (normally two to three times) to remove chemicals that may adhere to the surface. De-greasing removes oils from surfaces, whereas acid cleaning removes scaling.

Activation may be done with an immersion into a sensitizer/activator solution—for example, a mixture of palladium chloride, tin chloride, and hydrochloric acid. In the case of non-metallic substrates, a proprietary solution is often used.

The pre-treatment required for the deposition of metals on a non-conductive surface usually consists of an initial surface preparation to render the substrate hydrophilic. Following this initial step, the surface may be activated by a solution of a noble metal, e.g., palladium chloride. Electroless bath formation varies with the activator. The substrate is then ready for electroless deposition.

The reaction is accomplished when hydrogen is released by a reducing agent, normally sodium hypophosphite (with the hydrogen leaving as a hydride ion) or thiourea, and oxidized, thus producing a negative charge on the surface of the part. The most common electroless plating method is electroless nickel plating, although silver, gold and copper layers can also be applied in this manner.

In principle, any hydrogen-based reducing agent can be used although the redox potential of the reducing half-cell must be high enough to overcome the energy barriers inherent in liquid chemistry. Electroless nickel plating most often employs hypophosphite as the reducer while plating of other metals like silver, gold and copper typically makes use of low-molecular-weight aldehydes.

A benefit of this approach is that the technique can be used to plate diverse shapes and types of surfaces.

Figure 1B:
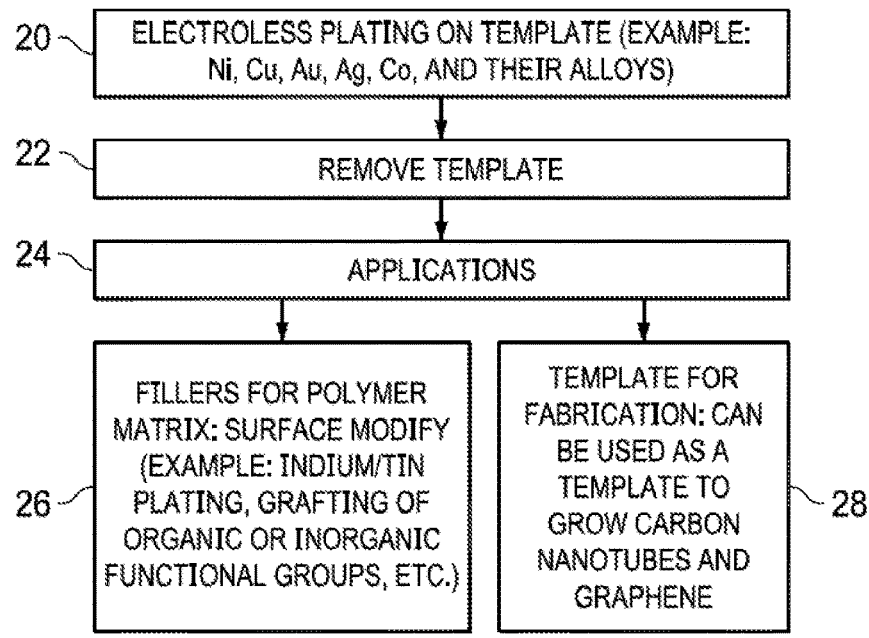
FIG. 1B is a flowchart for the fabrication process depicted schematically in FIG. 1A.
Figure 2:
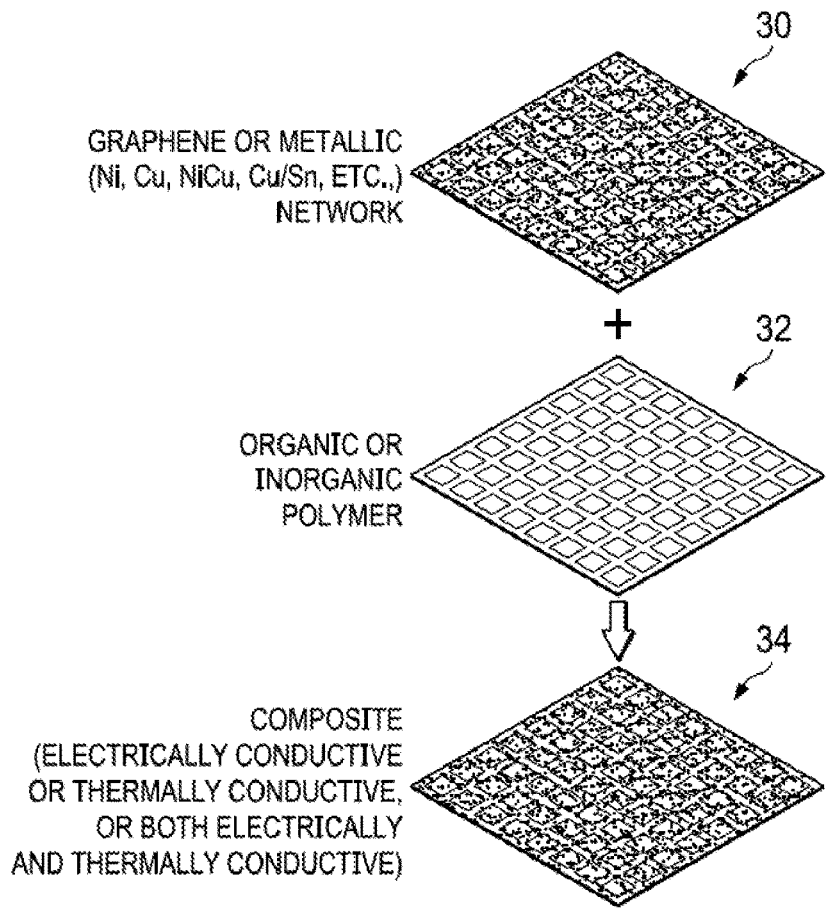
FIG. 2 is a schematic diagram of the fabrication of an electrically, thermally, or both thermally and electrically conductive composite by embedding a fabricated metal-based or graphene-based microlattice within an organic polymer matrix.

As illustrated in FIG. 1B, the organic polymeric microlattice may be electrolessly plated 20 with metal followed by dissolving out 22 the organic polymer scaffold. The resulting metal-based microlattice may be used in several applications 24—e.g. it may then be coated with a thin layer of immersion tin in order to prevent the metal from oxidizing during the subsequent process which may include a heat treatment. Alternatively, the surface of the metal-based microlattice may be functionalized with appropriate functional groups 26 in order to provide anchoring or reactions sites for subsequent interaction with a polymer matrix. A copper/nickel super-lattice may be used. The fabricated and surface-treated metallic network 30 may be embedded within an organic polymeric matrix 32 to fabricate an electrically or thermally or both an electrically and thermally conductive composite 34 (see FIG. 2). Alternatively, the fabricated metal-based microlattice may be used as a template 28 to synthesize a graphitic carbon superstructure. The metal may then be etched away to produce a graphene microstructure comprising a plurality of interconnected units wherein the units are formed of interconnected graphene tubes that are interconnected by chemical electronic bonds (as distinguished from van der Waals forces which may cause carbon nanotubes to agglomerate).

In another example, metal-coated organic polymeric microlattices may be used as fillers in a polymer matrix. A method of forming such a composite material may comprise: photo-initiating the polymerization of a monomer in a pattern of interconnected units to form polymer microlattices; removing unpolymerized monomer; coating the polymer microlattices with a metal; and dispersing the metal-coated polymer microlattices in a polymer matrix. As described above, the metal coating may be applied by an electroless process.

In yet another example, hexagonal boron nitride (h-BN) may be grown on the metal-based microlattice (in the place of graphene) to produce a ceramic microstructure that is an electrical insulator with high thermal conductivity. A process for growing h-BN on a metal-based microlattice is described in co-owned U.S. patent application Ser. No. 16/230,070 filed Dec. 21, 2018.

Other ceramic materials such as alumina ($Al_2O_3$), zirconia ($ZrO_2$), titania ($TiO_2$), multilayers of alumina-titania, multilayers of alumina-zirconia, etc. may be coated on the fabricated metal-based microlattice template using Atomic Layer Deposition (ALD), or chemical vapor deposition (CVD), or the like. Subsequent removal of the metal-based template (by e.g. etching) leaves a ceramic microlattice.

Figure 3:
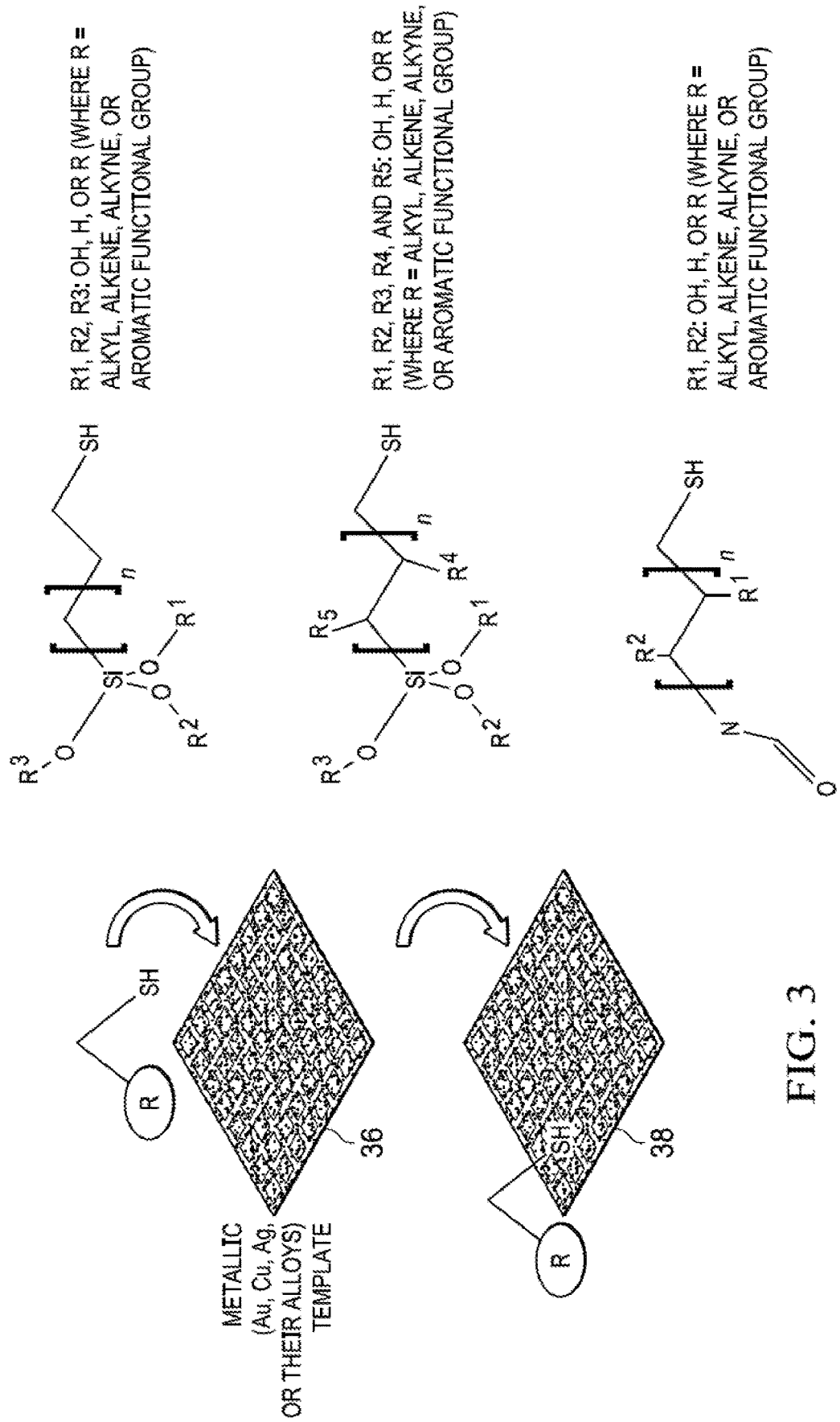
FIG. 3 is a schematic diagram of a surface functionalization methodology for functionalizing a fabricated metal-based microlattice.
Figure 4:
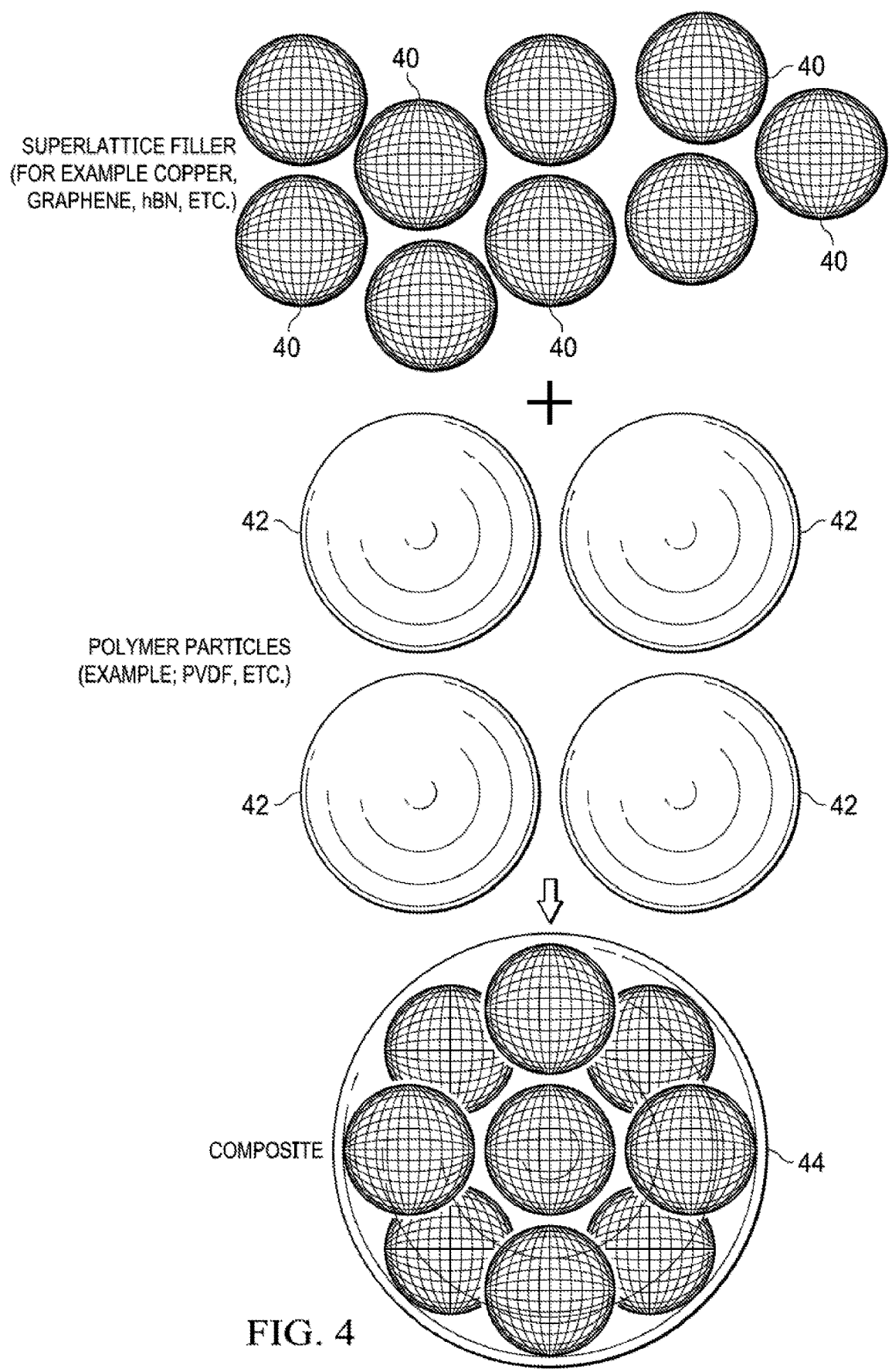

FIG. 3 schematically illustrates a surface treatment methodology for functionalizing the fabricated metal-based microlattice. As shown, the surface of the metal microlattice 36 may be exposed to a mercaptan-based compound. The mercaptan-based compound may be a hydroxylated alkyl mercaptan such as 3-mercapto-1,2 dihydroxy propane or it may be based on an isocyanate functional group such as isocyanate alkyl trialkoxy silane. The mercaptan-based compound bonds to the metal (such as e.g. copper, silver or gold) through the sulfur atom of the mercapto moiety resulting in a hydroxylated metal surface 38. The hydroxyl functional groups implanted on the metal surface may then be reacted with a reactive functional group from the pre-polymer matrix (which may comprise a mixture of oligomers). In the case of isocyanate-based mercaptan compounds, the free isocyanate functional groups may subsequently be reacted with certain functional groups of the organic polymeric matrix such as —OH, —NH, etc. resulting in the formation of chemical bonds at the metal-organic polymer interface. The polymer 42 for the composite 44 may be selected for its mechanical properties and/or electronic properties. Example polymers include fluorocarbons (such as polytetrafluoroethylene) and polybutadiene.

Modifications are possible in the described embodiments, and other embodiments are possible, within the scope of the claims.

What is claimed is:

1. A method comprising:
   photo-initiating a polymerization of a monomer to form a polymer microlattice;
   coating the polymer microlattice with a metal;
   removing the polymer microlattice to form a metal microlattice;
   depositing a ceramic material on the metal microlattice; and
   removing the metal microlattice to form a microstructure of the ceramic material.

2. The method of claim 1, wherein the photo-initiating including passing collimated light through a photomask.

3. The method of claim 1, wherein the photo-initiating including multi-photon lithography.

4. The method of claim 1, wherein coating the polymer microlattice with a metal comprises an electroless deposition of copper.

5. The method of claim 1, wherein coating the polymer microlattice with a metal comprises an electroless deposition of nickel.

6. The method of claim 1, wherein the polymer microlattice comprises polystyrene.

7. The method of claim 1, wherein the polymer microlattice comprises poly(methyl methacrylate).

8. The method of claim 1, wherein the ceramic material includes graphitic carbon.

9. The method of claim 1, wherein the ceramic material includes hexagonal boron nitride.

10. The method of claim 1, wherein the ceramic material includes at least one of: an aluminum oxide material, a zirconium oxide material, or a titanium oxide material.

11. The method of claim 1, wherein depositing the ceramic material on the metal microlattice includes at least one of: an atomic layer deposition operation, or a chemical vapor deposition operation.

12. The method of claim 1, further comprising performing a surface treatment operation on the metal microlattice.

13. The method of claim 12, wherein the performing a surface treatment operation on the metal microlattice includes functionalizing a surface of the metal microlattice.

14. The method of claim 13, wherein functionalizing a surface of the metal microlattice includes exposing the surface to a mercaptan-based compound.

15. The method of claim 14, wherein the mercaptan-based compound includes at least one of: a hydroxylated alkyl mercaptan, or an isocyanate-based mercaptan.

16. The method of claim 1, further comprising dispersing the microstructure of the ceramic material in a polymer matrix.

\* \* \* \* \*